US009197276B2

(12) United States Patent
Endo

(10) Patent No.: US 9,197,276 B2
(45) Date of Patent: Nov. 24, 2015

(54) SEMICONDUCTOR DEVICE, RADIO COMMUNICATION TERMINAL, AND METHOD FOR CONTROLLING SEMICONDUCTOR DEVICE

(71) Applicant: Renesas Mobile Corporation, Tokyo (JP)

(72) Inventor: Ryo Endo, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 182 days.

(21) Appl. No.: 14/083,629

(22) Filed: Nov. 19, 2013

(65) Prior Publication Data

US 2014/0162571 A1 Jun. 12, 2014

(30) Foreign Application Priority Data

Dec. 6, 2012 (JP) ................................ 2012-266839

(51) Int. Cl.

| | |
|---|---|
| ***H04B 7/00*** | (2006.01) |
| ***H04B 1/40*** | (2015.01) |
| ***H03L 7/085*** | (2006.01) |
| ***H03L 7/093*** | (2006.01) |
| ***H03L 7/099*** | (2006.01) |
| ***H03L 7/193*** | (2006.01) |

(52) U.S. Cl.

CPC *H04B 1/40* (2013.01); *H03L 7/085* (2013.01); *H03L 7/093* (2013.01); *H03L 7/099* (2013.01); *H03L 7/193* (2013.01); *H03L 2207/50* (2013.01)

(58) Field of Classification Search

CPC .............................. H03L 7/08; H03L 2207/50
USPC ...................... 455/180.3, 259, 260, 255, 257; 327/147, 156, 16, 17; 324/76.53; 375/375, 376, 373, 215, 294

See application file for complete search history.

(56) References Cited

U.S. PATENT DOCUMENTS

| | | | | |
|---|---|---|---|---|
| 5,450,621 | A * | 9/1995 | Kianush et al. ............ | 455/192.2 |
| 8,350,605 | B2 * | 1/2013 | Lin et al. ........................ | 327/156 |
| 8,461,886 | B1 * | 6/2013 | Yao ............................... | 327/156 |
| 8,471,614 | B2 * | 6/2013 | Luo ............................... | 327/158 |
| 8,634,511 | B2 * | 1/2014 | Hong et al. .................... | 375/371 |
| 8,754,713 | B2 * | 6/2014 | Uozumi et al. ............... | 331/1 A |
| 2010/0097151 | A1 * | 4/2010 | Arai ................................ | 331/25 |

FOREIGN PATENT DOCUMENTS

JP 2011-155601 A 8/2011

* cited by examiner

*Primary Examiner* — Sonny Trinh

(74) *Attorney, Agent, or Firm* — Miles & Stockbridge P.C.

(57) ABSTRACT

A semiconductor device according to the present invention includes a PLL circuit, in which the PLL circuit includes: a phase difference detection unit that detects a phase difference between a reference signal and a division signal; a filter that outputs a control signal according to a detection result of the phase difference detection unit; an oscillation unit that outputs an oscillation signal of a frequency according to the control signal; a division unit that divides the oscillation signal to output it as the division signal; a noise intensity detection unit that detects a noise intensity of a predetermined frequency component included in the control signal; and a phase difference adjustment unit that adjusts a phase difference between the reference signal and the division signal based on the noise intensity detected by the noise intensity detection unit.

12 Claims, 14 Drawing Sheets

| I | 1 | 2 | ... | 7 | 8 |
|---|---|---|---|---|---|
| PFD offset [LSB] | 64 | 80 | ... | 160 | 172 |
| SPURIOUS |  |  | |  |  |
| FT OUTPUT (SL) [LSB] | 200 | 153 | ... | 20 | 220 |
| MinSL [LSB] | 200 | 153 | ... | 20 | 20 |
| Min offset [LSB] | 64 | 80 | ... | 160 | 160 |

SEMICONDUCTOR DEVICE, RADIO COMMUNICATION TERMINAL, AND METHOD FOR CONTROLLING SEMICONDUCTOR DEVICE

CROSS-REFERENCE TO RELATED APPLICATIONS

This application is based upon and claims the benefit of priority from Japanese patent application No. 2012-266839, filed on Dec. 6, 2012, the disclosure of which is incorporated herein in its entirety by reference.

BACKGROUND

The present invention relates to a semiconductor device such as a high-frequency signal processing device including a PLL circuit etc., a radio communication terminal, and a method for controlling the semiconductor device.

A high-frequency signal processing device used for a radio communication terminal etc. is provided with a PLL (Phase-Locked Loop) circuit such as a digital-type PLL circuit. For example, Japanese Unexamined Patent Application Publication No. 2011-155601 discloses a configuration of a digital-type PLL circuit.

SUMMARY

The inventor of the present application has found various problems in developing a high-frequency signal processing device used for a radio communication terminal etc. Each embodiment disclosed in the present application, for example, provides a semiconductor device suitable for the radio communication terminal. More detailed features will be apparent from the description of the specification and accompanying drawings.

One aspect disclosed in the specification includes a PLL circuit, and the PLL circuit is provided with: a noise intensity detection unit that detects a noise intensity of a predetermined frequency component; and a phase difference adjustment unit that adjusts a phase difference between a reference signal and a division signal based on the noise intensity detected by the above-described noise intensity detection unit.

According to the above-described one embodiment, a good quality semiconductor device, a good quality radio communication terminal, and a method for controlling the semiconductor device can be provided.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

<Previous Examination by Inventor>

Before the embodiments of the present invention are explained, the contents of the previous examination that the present inventor conducted will be explained.

Figure 9:
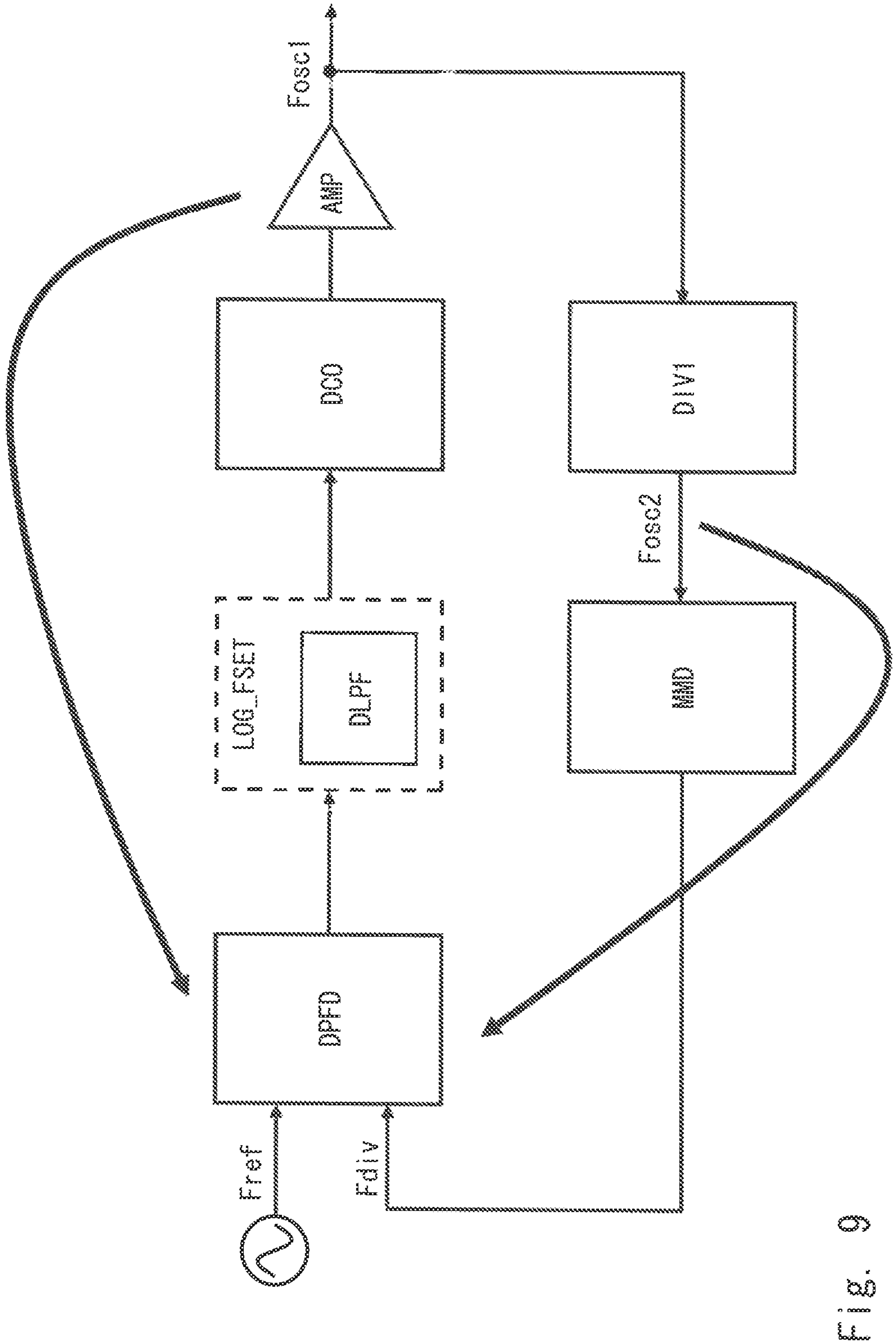
FIG. 9 is a block diagram showing a configuration of a digital-type PLL circuit that the present inventor has examined.

A high-frequency signal processing device used for a radio communication terminal etc. is provided with a PLL circuit such as a digital-type PLL circuit as described above, FIG. 9 is a block diagram showing a configuration of a digital-type PLL circuit that the present inventor has examined. The digital-type PLL circuit shown in FIG. 9 is provided with: a digital phase difference detector DPFD; a digital low-pass filter DLPF; a digital control oscillator DCO; an amplifier AMP; a divider DIV1; and a multi-modulus divider (division unit) MMD.

The digital phase difference detector DPFD detects a phase difference between a reference oscillation signal Fref and a division oscillation signal Fdiv. The digital low-pass filter DLPF outputs a digital code (control signal) according to a detection result of the digital phase difference detector DPFD. The digital control oscillator DCO outputs an oscillation signal Fosc1 of a frequency according to the digital code output from the digital low-pass filter DLPF. The oscillation signal Fosc1 is amplified by the amplifier AMP. The divider DIV1 divides (for example, half-divides) the oscillation signal Fosc1 amplified by the amplifier AMP, and outputs it as an oscillation signal Fosc2. The multi-modulus divider MMD divides the oscillation signal Fosc2 with a division ratio not more than a decimal point, and outputs it as the division oscillation signal Fdiv.

Here, a spurious noise is generated in a spurious frequency Fspur expressed by the following Expression (1) by means of coupling between an oscillator-related signal (for example, the oscillation signal Fosc1 or Fosc2) and a reference signal (for example, the reference oscillation signal Fref). It is conceived that the coupling is, for example, caused by the oscillator-related signal propagating to a reference signal side through a signal line of a power source voltage VDD or a ground voltage VSS.

$$Fspur=|N\times Fosc-M\times Fref| \quad (1)$$

It is to be noted that Fspur indicates the spurious frequency (a spurious offset frequency), Fosc indicates a frequency of the oscillator-related signal (for example, the oscillation signal Fosc1 or Fosc2), Fref indicates a frequency of the reference oscillation signal. Fref, and that both M and N indicate arbitrary integers.

Here, the smaller Fspur, M, and N are, the stronger the coupling becomes, and the larger the spurious noise becomes. Since the spurious noise generated in a band of the digital-type PLL circuit in a specific channel among such spurious noises is not attenuated by the digital low-pass filter DLPF, it deteriorates a phase error characteristic in the specific channel. That is, the digital-type PLL circuit of FIG. 9 had a problem of deteriorating the phase error characteristic in the specific channel due to an effect of the spurious noise generated in the PLL band in the specific channel.

Figure 10:
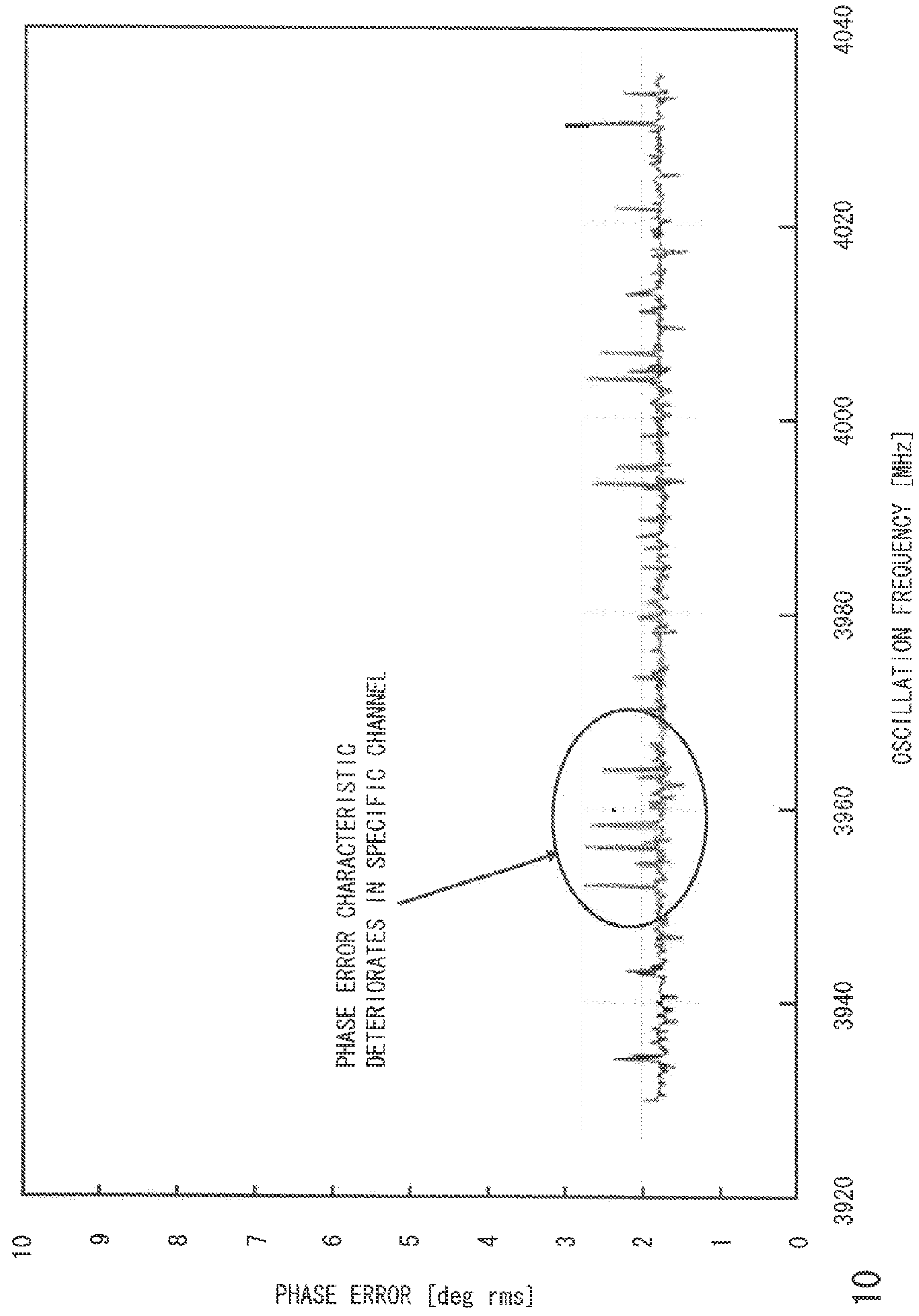
FIG. 10 is a graph showing a relation between an oscillation frequency and a phase error of the digital-type PLL circuit that the present inventor has examined.

FIG. 10 is a graph showing one example of a relation between an oscillation frequency and a phase error of the digital-type PLL circuit that the present inventor has examined. As shown in FIG. 10, the phase error characteristic has deteriorated by not less than 1 [degrms] in a specific channel.

Figure 11:
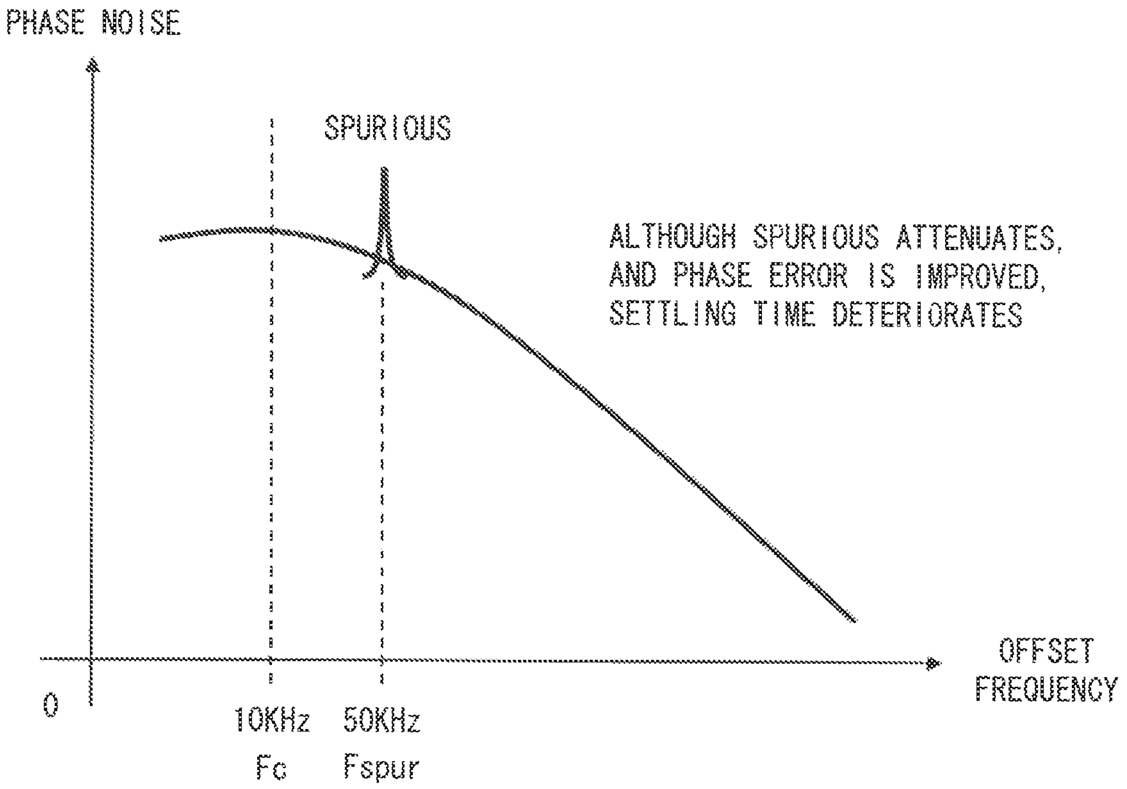
FIG. 11 is a graph showing a relation between an offset frequency and a phase noise of the digital-type PLL circuit that the present inventor has examined.

FIG. 11 shows a case where a spurious frequency is higher than a cutoff frequency Fc of the digital low-pass filter DLPF. In this case, the digital low-pass filter DLPF needs to sufficiently reduce the cutoff frequency Fc (for example, reduce it to not more than 10 kHz), and to remove (attenuate) a spurious noise generated in the spurious frequency Fspur. However, it is not preferable to reduce the cutoff frequency Fc since a settling time (a time until the oscillation signal Fosc1 stabilizes) is lengthened due to a narrower band.

Figure 12:
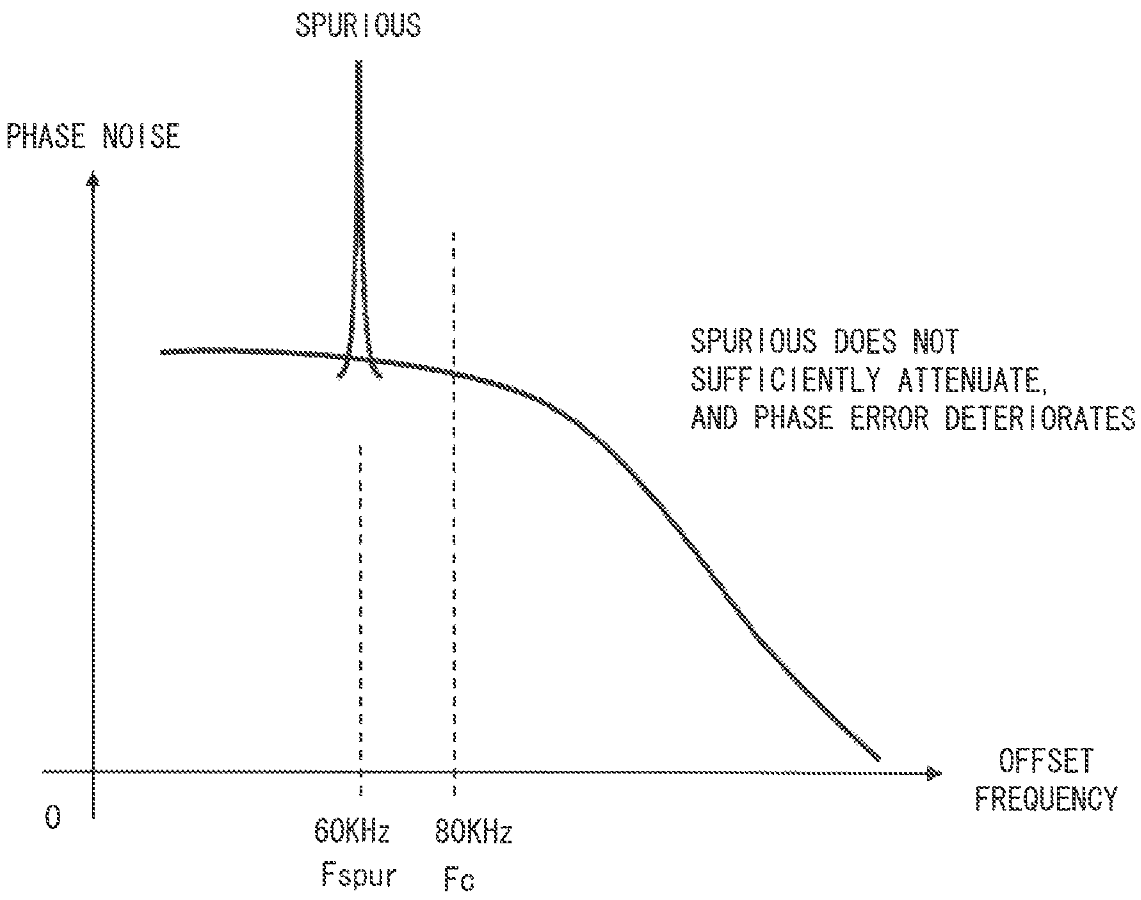
FIG. 12 is a graph showing a relation between an offset frequency and a phase noise of the digital-type PLL circuit that the present inventor has examined.

FIG. 12 shows a case where the spurious frequency is lower than the cutoff frequency Fc of the digital low-pass filter DLPF. In this case, it is conceived to make the cutoff frequency Fc lower in order to remove the spurious frequency. However, in the high-frequency signal processing device, since a transmission signal needs to be output by a high electric power, the cutoff frequency Fc cannot be made lower. In other words, since it is necessary to make the digital-type PLL circuit hold a wide band (for example, 80 kHz), the spurious noise generated in the spurious frequency Fspur cannot be removed.

As shown in examples of FIGS. 11 and 12, the spurious noise generated in the specific channel may not be removed by the digital low-pass filter DLPF. In such case, it is required that deterioration of the phase error characteristic in the specific channel be suppressed by suppressing the spurious noise by means of a method other than the method using the digital low-pass filter DLPF.

Furthermore, in an example shown in FIG. 9, there is a plurality of (two in the example) paths of coupling between the oscillator-related signal (for example, the oscillation signal Fosc1 or Fosc2) and the reference signal (for example, the reference oscillation signal Vref). Along with this plurality, there is also a plurality of spurious frequencies calculated by Expression (1).

Figure 13:
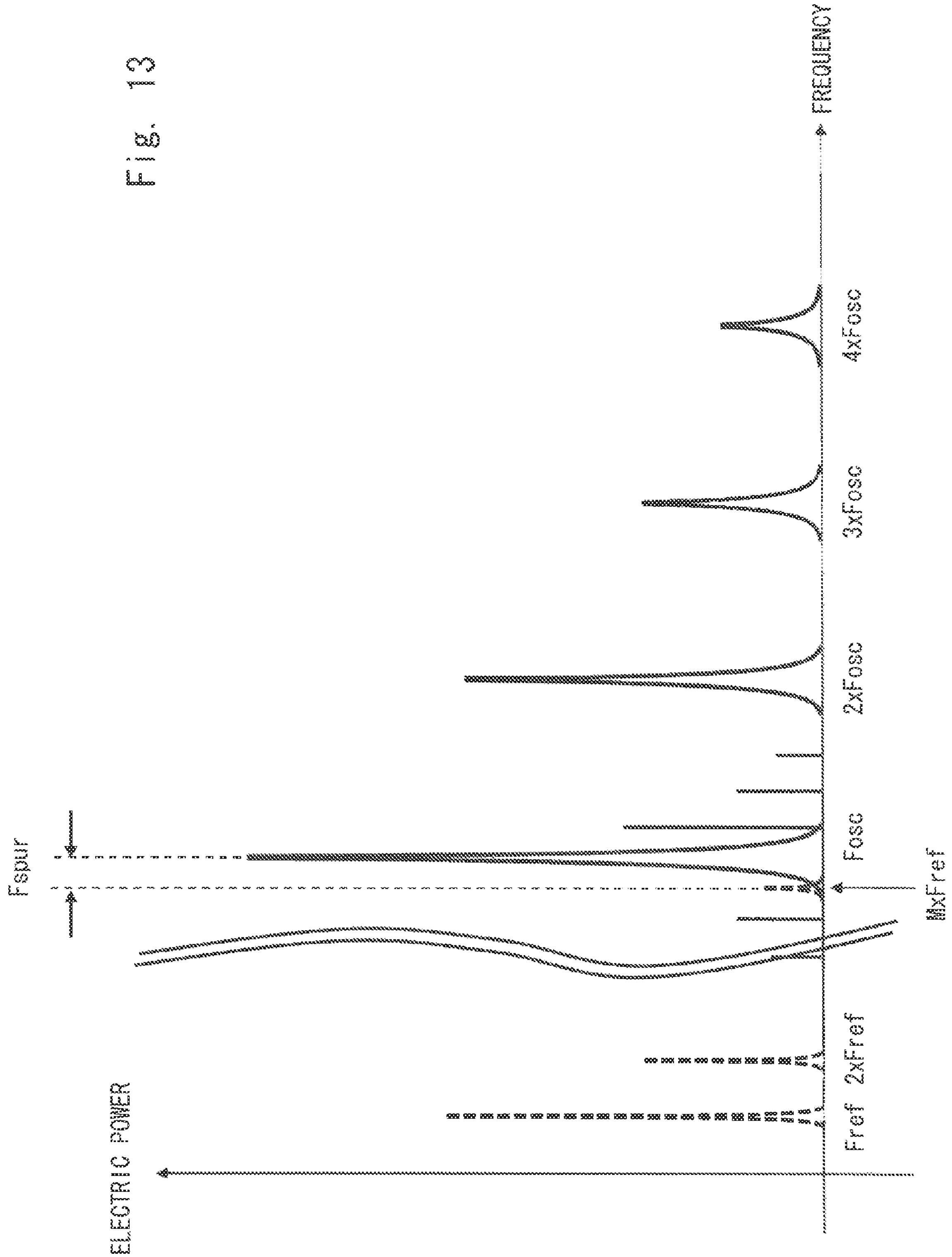
FIG. 13 is a graph showing a relation between a frequency and an electric power (a noise) of the digital-type PLL circuit that the present inventor has examined.

FIG. 13 is a graph showing a relation between a frequency and an electric power (a noise) of the digital-type PLL circuit that the present inventor has examined. As shown in FIG. 13, a harmonic M times as high as the reference oscillation signal Fref is coupled with a fundamental wave of the oscillator-related signal (Fosc1 here) Fosc, and thereby a large spurious noise is generated.

When there is a plurality of spurious types, a large spurious noise can be generated in each of these pluralities of spurious types. In such a case, it is required that the spurious noise against which measures need to be taken be previously specified, the specified spurious noise be suppressed, and that thereby deterioration of the phase error characteristic in the specific channel be suppressed.

Hereinafter, embodiments will be explained with reference to drawings. It is to be noted that since the drawings are simple, the technical scope of the embodiments must not be interpreted narrowly on the ground of the description of the drawings. In addition, components which are the same as each other are indicated by the same symbol, and an overlapping explanation is omitted.

Although the following embodiments will be explained, divided into a plurality of sections or embodiments if necessary for convenience, except for a case shown particularly clearly, these embodiments are not mutually unrelated, and one embodiment has relationships, such as being a modified example, an application example, detailed explanation, supplementary explanation, or the like with some or all of the other embodiments. In addition, in the following embodiments, when referring to the number of components etc. (including the number, a numeric value, an amount, a range, etc.), they may not be limited to the specific number but may not be less than or more than the specific number except for a case where they are particularly clearly expressed and where they are theoretically clearly limited to a specific number.

Furthermore, in the following embodiments, an element (including an operation step etc.) is not necessarily indispensable, except for a case where it is particularly clearly expressed and where it is considered to be theoretically clearly indispensable, etc. Similarly, in the following embodiments, when a shape, a positional relationship, etc. of a component etc. are referred to, what substantially resembles or is similar to the shape shall be included, except for the case where it is particularly clearly expressed and where it is considered to be theoretically clearly not right to include it. This statement also applies to the above-mentioned number of components etc. (including the number, a numeric value, an amount, a range, etc.).

First Embodiment

Figure 1A:
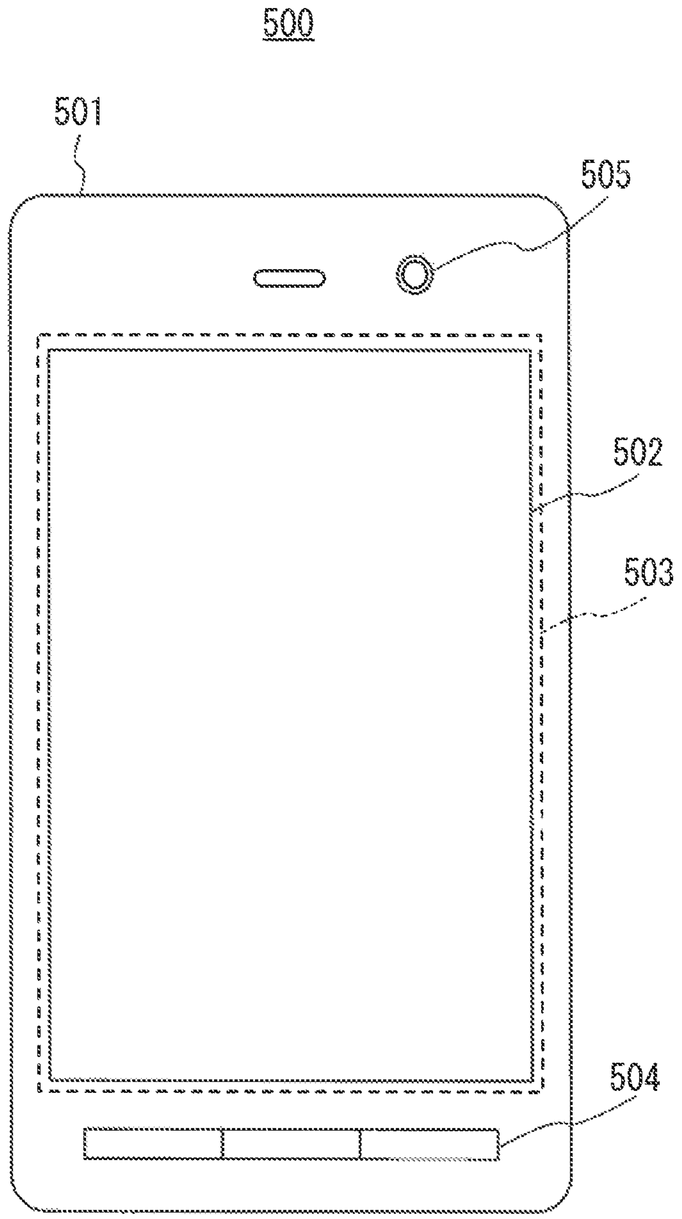
FIG. 1A is an external view showing one example of a radio communication terminal pertaining to a first embodiment.
Figure 1B:
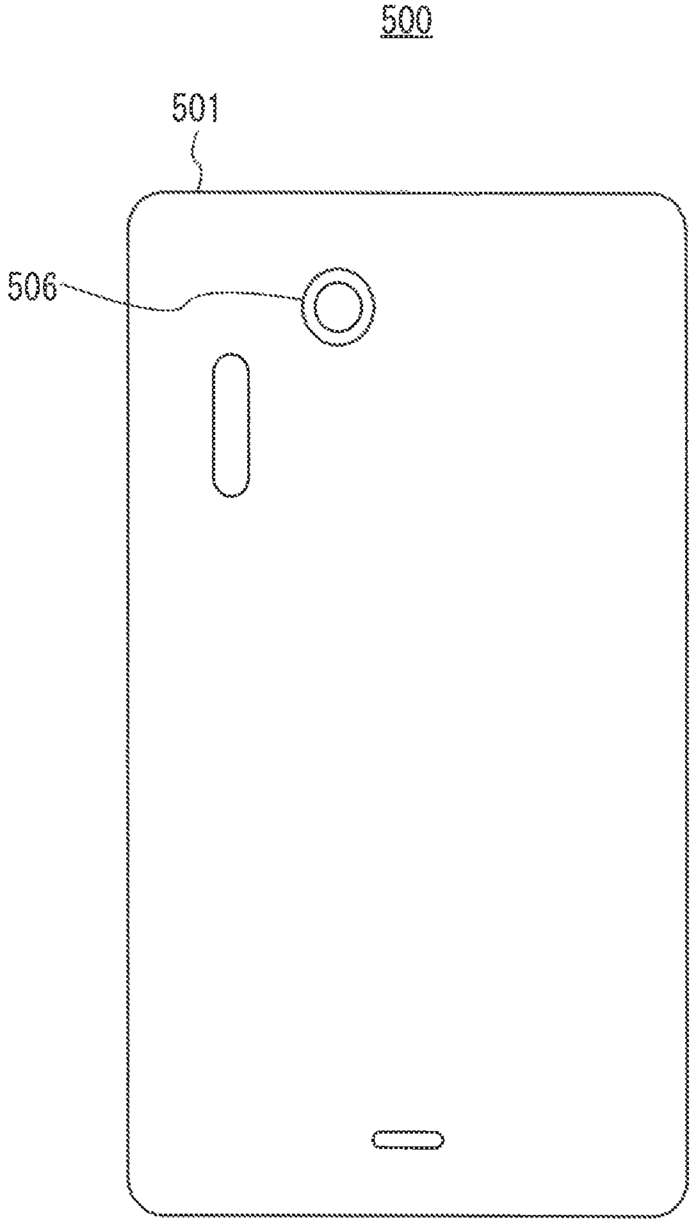
FIG. 1B is an external view showing one example of a radio communication terminal pertaining to a first embodiment.

First, with reference to FIGS. 1A and 1B, a description will be given of a radio communication terminal suitable as an electronic device to which a semiconductor device pertaining to the embodiment is applied. FIGS. 1A and 1B are external views showing a configuration example of a radio communication terminal 500. It is to be noted that FIGS. 1A and 1B show a case where the radio communication terminal 500 is a smartphone. However, the radio communication terminal 500 may be another radio communication terminal, such as a feature phone (for example, a folding mobile phone terminal), a mobile game terminal, a tablet PC (Personal Computer), and a notebook PC. In addition, it should be noted that the semiconductor device pertaining to the embodiment can also be applied to an electronic device other than the radio communication terminal.

FIG. 1A shows one main surface (front surface) of a housing 501 that forms the radio communication terminal 500. At the front surface of the housing 501, a display device 502, a touch panel 503, some manipulation buttons 504, and a camera device 505 are arranged. FIG. 1B shows the other main surface (back surface) of the housing 501. A camera device 506 is arranged at the back surface of the housing 501.

The display device 502 is an LCD (Liquid Crystal Display), an OLED (Organic Light-Emitting Diode) display, or the like, and it is arranged so that a display surface thereof is located at the front surface of the housing 501. The touch panel 503 is arranged so as to cover the display surface of the display device 502, or is arranged on a back surface side of the display device 502, and detects a position of the display surface contacted by a user. That is, the user can intuitively manipulate the radio communication terminal 500 by touching the display surface of the display device 502 with a finger, a dedicated pen (generally called a stylus), or the like. In addition, the manipulation button 504 is used for auxiliary manipulation of the radio communication terminal 500. It is to be noted that such manipulation buttons may not be provided depending on the radio communication terminal.

The camera device 506 is a main camera arranged so that a lens unit thereof is located at the back surface of the housing 501. Meanwhile, the camera device 505 is a sub-camera arranged so that a lens unit thereof is located at the front surface of the housing 501. It is to be noted that such sub-camera may not be provided depending on the radio communication terminal.

<Internal Configuration of Radio Communication Terminal 500>

Figure 2:
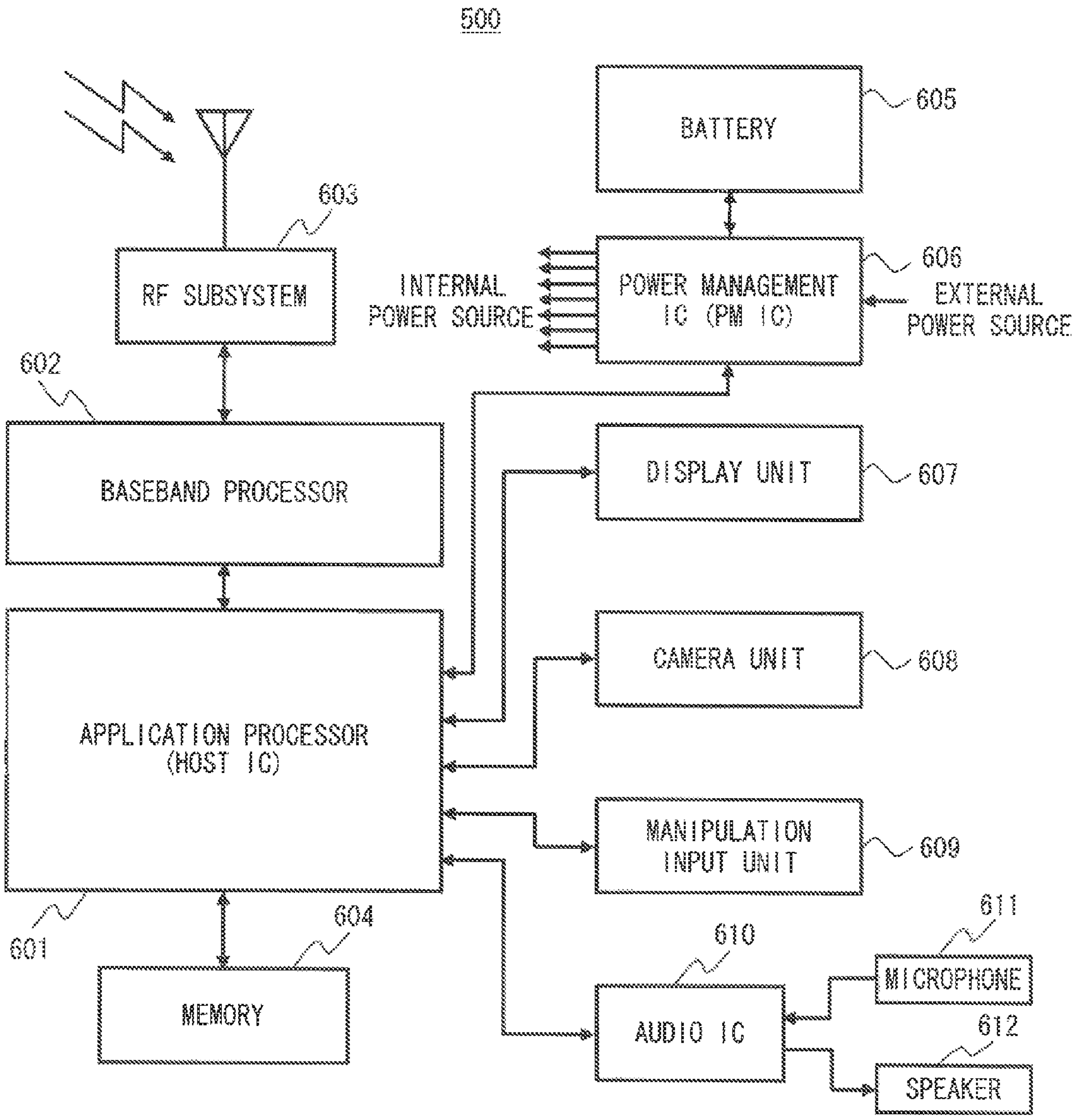
FIG. 2 is a block diagram showing an internal structure of the radio communication terminal pertaining to the first embodiment.

Next, an internal configuration of the radio communication terminal 500 pertaining to the embodiment will be explained with reference to FIG. 2 FIG. 2 is a block diagram showing one example of the internal configuration of the radio communication terminal 500 pertaining to the embodiment. As shown in FIG. 2, the radio communication terminal 500 includes: an application processor 601; a baseband processor 602; an RF (Radio Frequency) subsystem 603; a memory 604; a battery 605; a PMIC (Power Management Integrated Circuit) 606; a display unit 607; a camera unit 608; a manipulation input unit 609; an audio IC 610; a microphone 611; and a speaker 612.

The application processor 601 reads a program stored in the memory 604, and performs processing for achieving various functions of the radio communication terminal 500. For example, the application processor 601 executes an OS (Operating System) program from the memory 604, and executes an application program that uses the OS program as an operational base.

The baseband processor 602 performs baseband processing including encoding (for example, error correction encoding of a convolutional code, a turbo code, etc.) processing or decoding processing with respect to data that the radio communication terminal 500 transmits and receives. More specifically, the baseband processor 602 receives transmission data from the application processor 601, applies encoding processing to the received transmission data, and transmits it to the RF subsystem 603. In addition, the baseband processor 602 receives reception data from the RF subsystem 603, applies decoding processing to the received reception data, and transmits it to the application processor 601.

The RF subsystem 603 performs modulation processing or demodulation processing on data that the radio communication terminal 500 transmits and receives. More specifically, the RF subsystem 603 performs modulation processing of the transmission data received from the baseband processor 602 by a carrier to generate a transmission signal, and outputs the transmission signal through an antenna. In addition, the RF subsystem 603 receives a reception signal through the antenna, performs demodulation processing of the reception signal by the carrier to generate reception data, and transmits the reception data to the baseband processor 602.

In the memory 604, a program and data that are utilized by the application processor 601 are stored. In addition, the memory 604 includes a nonvolatile memory that holds stored data even though a power source is interrupted, and a volatile memory in which the stored data is cleared when the power source is interrupted.

The battery 605 is an electric cell, and is utilized when the radio communication terminal 500 operates without using an external power source. It is to be noted that the radio communication terminal 500 may utilize a power source of the battery 605 also when the external power source is connected thereto. In addition, it is preferable to utilize a secondary battery as the battery 605.

The PMIC 606 generates an internal power source from the battery 605 or the external power source. The internal power source is given to each block of the radio communication terminal 500. At this time, the PMIC 606 controls a voltage of the internal power source for every block that receives a supply from the internal power source. The PMIC 606 performs voltage control of the internal power source based on an instruction from the application processor 601. Furthermore, the PMIC 606 can also control supply and interruption of the internal power source for every block. In addition, when the external power source is supplied, the PMIC 606 also performs charge control to the battery 605.

The display unit 607 is, for example, a liquid crystal display device, and displays various images in accordance with processing in the application processor 601. On the display unit 607, a user interface image in which the user gives an operation instruction to the radio communication terminal 500, a camera image, a moving image, or the like is displayed.

The camera unit 608 acquires an image in accordance with an instruction from the application processor. The manipulation input unit 609 is a user interface that the user manipulates to give a manipulation instruction to the radio communication terminal 500. The audio IC 610 decodes voice data transmitted from the application processor 601 to drive the speaker 612, also encodes voice information obtained from the microphone 611 to generate voice data, and outputs the voice data to the application processor 601.

<Specific Configuration Example of RF Subsystem 603>

Figure 3:
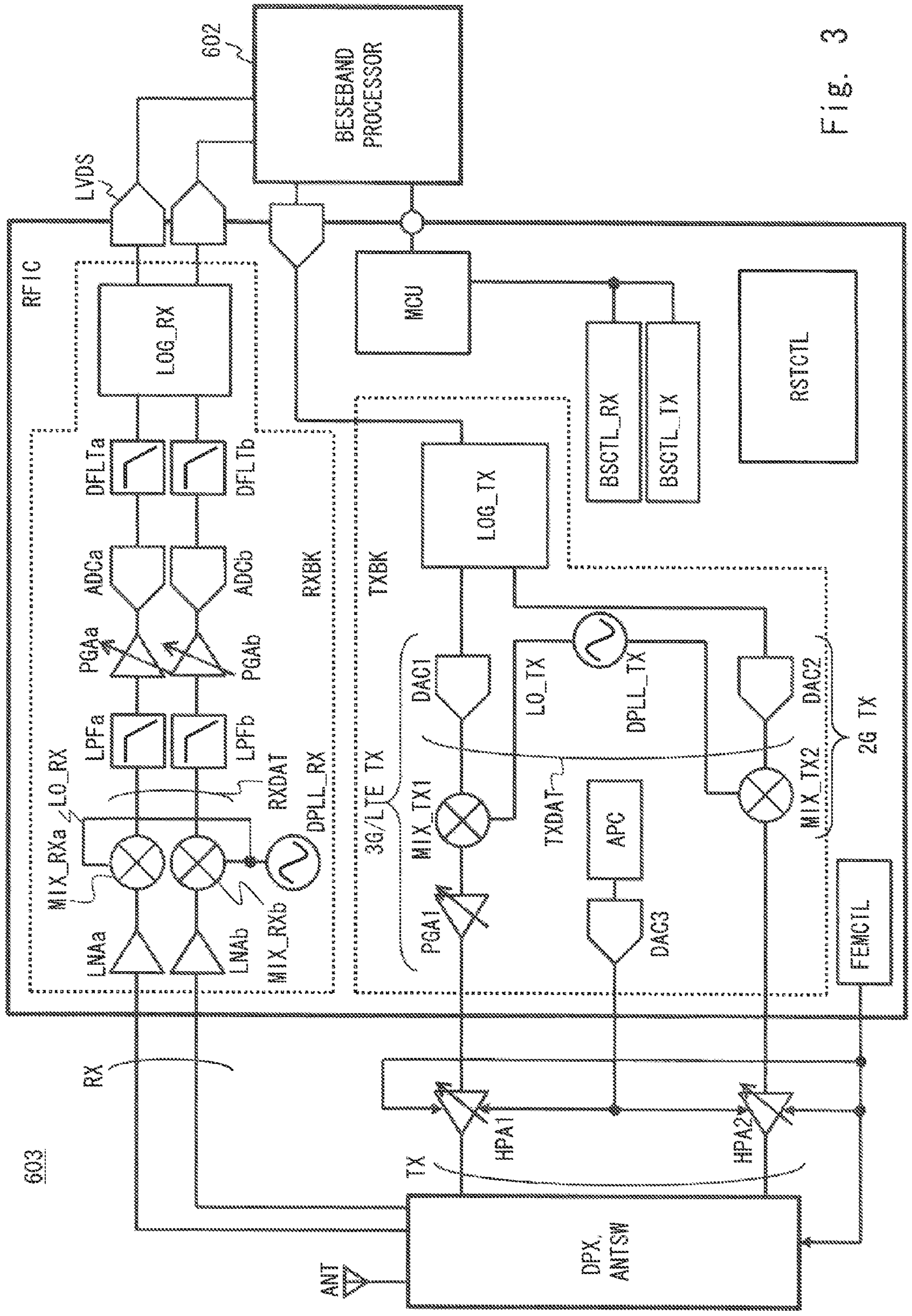
FIG. 3 is a block diagram showing a specific configuration example of an RF subsystem provided in the radio communication terminal pertaining to the first embodiment.

FIG. 3 is a block diagram showing a specific configuration example of the RF subsystem 603. The RF subsystem 603 shown in FIG. 3 is provided with: a high-frequency signal processing device RFIC; power amplifier circuits (electric power amplifier circuits) HPA1 and HPA2; a duplexer DPX; an antenna switch ANTSW; and an antenna ANT. It is to be noted that the baseband processor 602 is also shown in FIG. 3.

Although not particularly limited, the baseband processor 602 and the high-frequency signal processing device RFIC are realized by individual semiconductor chips formed in a CMOS manufacturing process, respectively, and the power amplifier circuits HPA1 and HPA2, the duplexer DPX, and the antenna switch ANTSW are, for example, realized by appropriately mounting a plurality of parts on one module wiring substrate (typically, a ceramic substrate)

<<High-Frequency Signal Processing Device RFIC>>

The high-frequency signal processing device RFIC is provided with: a transmission circuit block TXBK; a reception circuit block RXBK; and a control unit for both transmission and reception. In the control unit, the following are included: a microcomputer unit MCU; a transmitting bus control unit BSCTL_TX; a receiving bus control unit BSCTL_RX; a reset control unit RSCTL; and a front-end control unit FEMCTL. The microcomputer unit MCU includes a central processing circuit (processor unit), a memory unit, etc., and controls the whole high-frequency signal processing device RFIC while appropriately communicating with the baseband processor 602.

The transmitting bus control unit BSCTL_TX is connected to various circuits in the transmission circuit block TXBK through a bus, and performs control of the transmission circuit block TXBK based on a command from the microcomputer unit MCU. The receiving bus control unit BSCTL_RX is connected to various circuits in the reception circuit block RXBK through a bus, and performs control of the reception circuit block RXBK based on a command from the microcomputer unit MCU. When, for example, detecting power-on or receiving a command directed to the high-frequency signal processing device RFIC from outside, the reset control unit RSCTL appropriately controls power supply, operation clock supply, etc. to various circuits in the high-frequency signal processing device RFIC. The front-end control unit FEMCTL is controlled by the microcomputer unit MCU through the transmitting bus control unit BSCTL_TX and the receiving bus control unit BSCTL_RX, and, for example, performs control of activation/deactivation of the power amplifier circuits HPA1 and HPA2, control of the antenna switch ANTSW, etc.

The transmission circuit block TXBK is provided with: a transmitting logic circuit LOG_TX; DA converters DAC1 to DAC3; a transmitting digital-type PLL circuit DPLL_TX; transmitting mixer circuits MIX_TX1 and MIX_TX2; a variable gain amplifier circuit PGA1; and an automatic power control circuit APC. The DA converter DAC1, the mixer circuit MIX_TX1, and the variable gain amplifier circuit PGA1, for example, serve as processing circuits directed to W-CDMA (Wideband Code Division Multiple Access) (or HSDPA (High Speed Downlink Packet Access) that serves as an extended standard of the W-CDMA) or LTE (Long Term Evolution). The DA converter DAC2 and the mixer circuit MIX_TX2, for example, serve as processing circuits directed to GSM (registered trademark) (Global System for Mobile Communications).

In W-CDMA (HSDPA) and LTE, for example, more than ten frequency bands prescribed between a 700 MHz band to a 2.6 GHz band are appropriately used. In W-CDMA (HSDPA), phase and amplitude modulation schemes, such as QPSK (Quadrature Phase Shift Keying), HPSK (Hybrid Phase Shift Keying), and 16QAM (Quadrature Amplitude Modulation) are used, and in LTE, phase and amplitude modulation schemes, such as QPSK, 16QAM, and 64QAM are used. In GSM, for example, a 850 MHz band (GSM850), a 900 MHz band (GSM900), a 1.8 GHz band (DCS (Digital Cellular System) 1800), and a 1.9 GHz band (PCS (Personal Communications Service) 1900) are used. The GSM850 and GSM900 are called low bands of GSM or the like, and the DCS1800 and PCS1900 are called high bands of GSM or the like. In GSM, for example, phase (frequency) modulation schemes, such as GMSK (Gaussian filtered Minimum Shift Keying) and 8PSK are used.

The transmitting logic circuit LOG_TX receives a transmission data signal (transmission baseband signal) from the baseband processor 602 through a differential interface circuit LVDS, and performs predetermined digital processing (for example, 10B8B encoding, generation processing of a modulating digital baseband signal (phase information etc.), etc.). The DA converter DAC1 converts the modulating digital baseband signal from the transmitting logic circuit LOG_TX into an analog baseband signal TXDAT. The digital-type PLL circuit DPLL_TX generates a local signal (a local oscillation signal or a carrier signal) LO_TX having a predetermined transmission carrier frequency. The mixer circuit MIX_TX1 modulates and up-converts (performs frequency conversion of) the analog baseband signal TXDAT from the DA converter DAC1 using the local signal LO_TX from the digital-type PLL circuit DPLL_TX. The variable gain amplifier circuit PGA1 amplifies an output signal of the mixer circuit MIX_TX1 by a predetermined gain, and outputs it toward the power amplifier circuit HPA1.

The DA converter DAC2 converts the modulating digital baseband signal from the transmitting logic circuit LOG_TX into the analog baseband signal TXDAT. The mixer circuit MIX_TX2 modulates and up-converts the analog baseband signal TXDAT from the DA converter DAC2 using the local signal LO_TX from the digital-type PLL circuit DPLL_TX, and outputs it toward the power amplifier circuit HPA2. The automatic power control circuit APC controls the power amplifier circuits HPA1 and HPA2 through the DA converter DAC3 so that output powers thereof become target values. It is to be noted that since a modulation scheme in which envelope fluctuations occur is used in W-CDMA (HSDPA) and LTE unlike constant envelope modulation in a GSM mode (GMSK modulation), the RF subsystem is provided with the variable gain amplifier circuit PGA1. In addition, for example, a transmission carrier frequency in the digital-type PLL circuit DPLL_TX, a gain of the variable gain amplifier circuit PGA1, and a target value of an output power in the automatic power control circuit APC are set by the microcomputer unit MCU through the transmitting bus control unit BSCTL_TX.

The reception circuit block RXBK is provided with: low noise amplifier circuits LNAa and LNAb; receiving mixer circuits MIX_RXa and MIX_RXb; low-pass filters LPFa and LPFb; variable gain amplifier circuits PGAa and PGAb; AD converters ADCa and ADCb; digital filters DFLTa and DFLTb; a receiving digital-type PLL circuit DPLL_RX; and a receiving logic circuit LOG_RX. Here, what is called a reception diversity configuration is employed, and two types of paths from the low noise amplifier circuit to the digital filter are provided. It is to be noted that reception diversity is a mechanism where a plurality of antennas are prepared, inputs are selected and synthesized, and thereby a signal intensity is increased.

Both of the low noise amplifier circuits LNAa and LNAb amplify a reception power signal RX input through the duplexer DPX and the antenna switch ANTSW by a low noise. The digital-type PLL circuit DPLL_RX generates a local signal (a local oscillation signal or a carrier signal) LO_RX having a predetermined reception carrier frequency. The mixer circuits MIX_RXa and MIX_RXb demodulate and down-convert (perform frequency conversion of) output signals of the low noise amplifier circuits LNAa and LNAb using the local signal LO_RX from the digital-type PLL circuit DPLL_RX, respectively, and output analog baseband signals RXDAT. The low-pass filters LPFa and LPFb remove unnecessary high frequency components in the analog baseband signals RXDAT from the mixer circuits MIX_RXa and MIX_RXb, respectively.

The variable gain amplifier circuits PGAa and PGAb amplify output signals of the low-pass filters LPFa and LPFb by a gain to which input ranges of the AD converters ADCa and ADCb have been added, respectively. The AD converters ADCa and ADCb convert analog signals from the variable gain amplifier circuits PGAa and PGAb into digital baseband signals, respectively. The digital filters DFLTa and DFLTb perform filtering processing, such as interpolation and decimation, of the digital baseband signals from the AD converters ADCa and ADCb, respectively. The receiving logic circuit LOG_RX performs predetermined digital processing for example, 8B10B decoding etc.) of digital signals from the digital filters DFLTa and DFLTb, and outputs the results to the baseband processor 602 through the differential interface circuit LVDS as reception data signals (reception baseband signals) It is to be noted that, for example, a reception Carrier frequency in the digital-type PLL circuit DPLL_RX is set by the microcomputer unit MCU through the receiving bus control unit BSCTL_RX.

<<Power Amplifier Circuits HPA1 and HPA2>>

The power amplifier circuits HPA1 and HPA2 are, for example, achieved by an LDMOSFET (Laterally Diffused Metal Oxide Semiconductor Field Effect Transistor), an HBT (Hetero-junction Bipolar Transistor), etc. The power amplifier circuit HPA1 amplifies an output signal of the variable gain amplifier circuit PGA1 in the above-mentioned high-frequency signal processing device RFIC, and outputs it to the duplexer DPX and the antenna switch ANTSW as a transmission power signal TX. The power amplifier circuit HPA2 amplifies an output signal of the transmitting mixer circuit MIX_TX2 in the above-mentioned high-frequency signal processing device RFIC, and outputs it to the duplexer DPX and the antenna switch ANTSW as the transmission power signal TX.

It is to be noted that, for example, an electric power detection circuit (coupler) or the like, though not shown, is provided in output nodes of the power amplifier circuits HPA1 and HPA2, and that the above-mentioned automatic power control circuit APC controls output powers of the power amplifier circuits HPA1 and HPA2 by comparing a target value from the microcomputer unit MCU with a detection result of the electric power detection circuit. In addition, although for example, one power amplifier circuit HPA1 is representatively shown here as being directed to W-CDMA or the like, actually, the plurality of power amplifier circuits HPA1 are provided in order to deal with wide frequency bands, such as the 700 MHz band to the 2.6 GHz band, and the plurality of mixer-circuits MIX_TX1 or the like are also provided in the high-frequency signal processing device RFIC according to the power amplifier circuits HPA1. The same is true on the power amplifier circuit HPA2 and further, the same is also true on the low noise amplifier circuits LNAa and LNAb in the high-frequency signal processing device RFIC.

<<Duplexer DPX and Antenna Switch ANTSW>>

The duplexer DPX is, for example, achieved by SMD (Surface Mount Device) parts, a wiring pattern on a module wiring substrate, etc., and separates a transmission frequency band from a reception frequency band. The antenna switch ANTSW is, for example, achieved by an MMIC (Monolithic Microwave IC) using a compound semiconductor substrate of gallium arsenide (GaAs) etc. and an SOI (Silicon on Insulator) substrate, etc., and appropriately controls a connection destination of the antenna ANT. Usually, combination of the antenna ANT and the transmission power signal TX or the reception Dower signal RX is performed through the antenna switch ANTSW in accordance with a TDD (Time Division Duplex) scheme in GSM, and it is performed through the duplexer DPX in accordance with an FDD (Frequency Division Duplex) scheme in W-CDMA and LTE.

As described above, it becomes easy to realize a smaller area, a lower power source voltage, higher performance (higher speed), etc. by applying the digital-type PLL circuits DPLL_TX and DPLL_RX in the high-frequency signal processing device RFIC. However, these digital-type PLL circuits, as described above, deteriorate a phase error characteristic in a specific channel due to an effect of a spurious noise generated in a PLL band in the specific channel, if no measures are taken. Consequently, in the digital-type PLL circuit pertaining to the first embodiment, the above problem is solved by suppressing a coupling strength by adjusting the phase difference between the Fref and the Fosc.

Hereinafter, the digital-type PLL circuit will be specifically explained.

<Specific Configuration Example of Digital-Type PLL Circuit Pertaining to First Embodiment>

Figure 4:
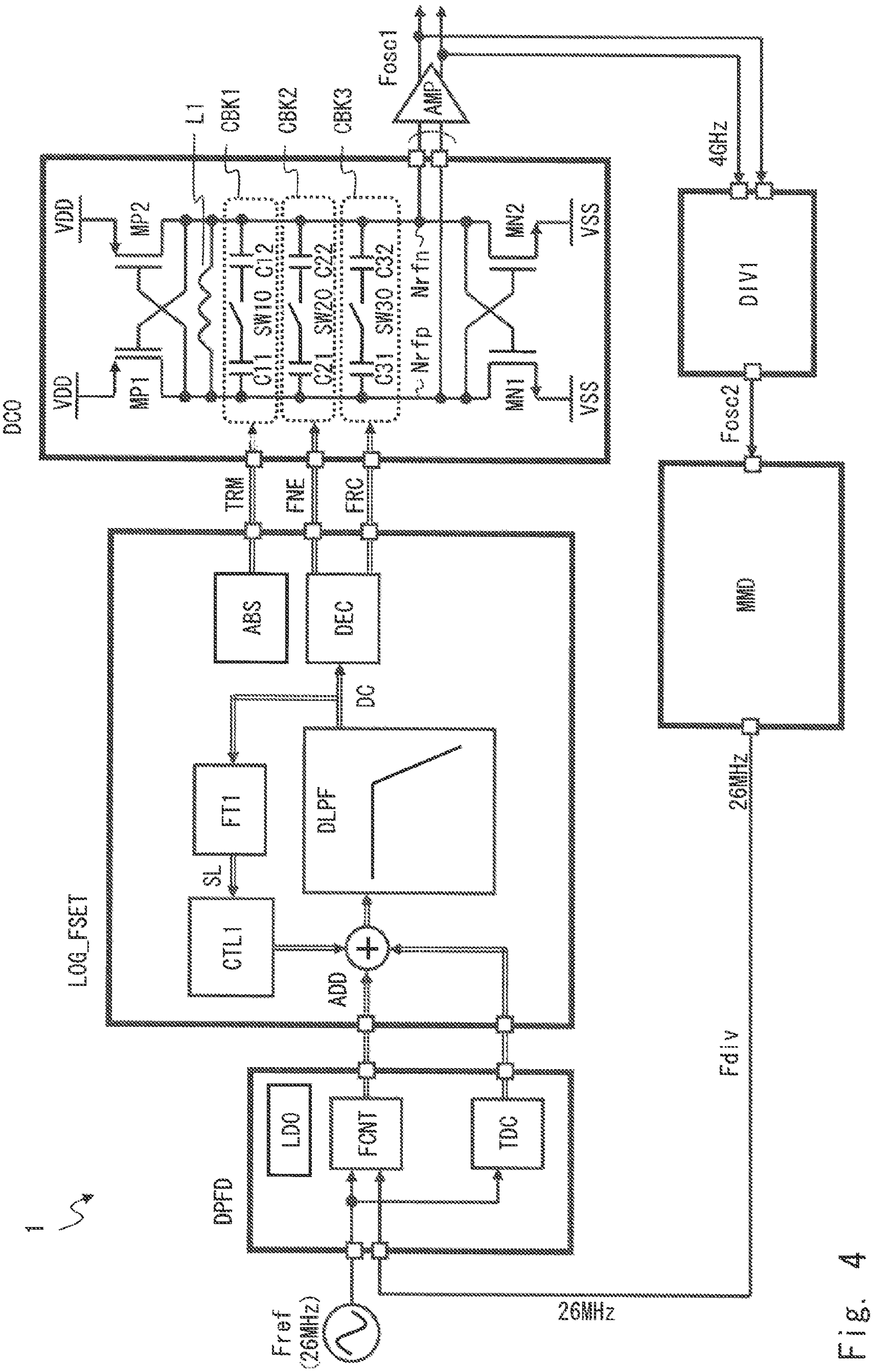
FIG. 4 is a diagram showing a configuration example of a digital-type PLL circuit pertaining to the first embodiment.

FIG. 4 is a block diagram showing a configuration example of a digital-type PLL circuit 1 pertaining to the first embodiment. The digital-type PLL circuit 1 shown in FIG. 4 is, for example, applied to each of the digital-type PLL circuits DPLL_TX and DPLL_RX that are provided in the high-frequency signal processing device RFIC shown in FIG. 3.

The digital-type PLL circuit 1 shown in FIG. 4 is provided with: a digital phase difference detector (phase difference detection unit) DPFD; a frequency setting logic unit LOG_FSET; digital control oscillator (oscillation unit) DCO; the amplifier AMP; the divider DIV1; and the multi-modulus divider (division unit) MMD.

<<Digital Phase Difference Detector DPFD>>

The digital phase difference detector DPFD detects the phase difference between the reference oscillation signal (reference signal) Fref having a reference oscillation frequency (for example, 26 MHz) generated by a crystal oscillation circuit etc. and the division oscillation signal (division signal) Fdiv generated by the multi-modulus divider MMD.

Specifically, the digital phase difference detector DPFD is provided with: a power source regulator LDO; a frequency difference detection counter FCNT; and a time difference detection circuit TDC. The power source regulator LDO generates a power source voltage of the digital-type PLL circuit 1. The frequency difference detection counter FCNT counts the reference oscillation signal Fref and the division oscillation signal Fdiv, respectively, and thereby detects the frequency difference therebetween. The time difference detection circuit TDC, for example, has plural stages of unit delay circuits (CMOS inverter circuits), and detects the phase difference between the division oscillation signal Fdiv and the reference oscillation signal Fref. Specifically, for example, the time difference detection circuit TDC sequentially delays the division oscillation signal Fdiv in the unit delay circuits, synchronously latches an output of each unit delay circuit to the reference oscillation signal Fref, and detects the phase difference in view of the latch result. The smaller a delay amount of the unit delay circuit becomes along with the miniaturization of a CMOS manufacturing process, the higher the accuracy of the phase difference detection result achieved.

<<Frequency Setting Logic Unit LOG_FSET>>

The frequency setting logic unit LOG_FSET is provided with: an automatic band selection unit ABS; an adder ADD; the digital low-pass filter (filter) DLPF; an decoder DEC; the noise intensity detection unit FT1; and the phase difference adjustment unit CTL1. The automatic band selection unit ABS, for example, detects a frequency difference between the division oscillation signal Fdiv and the reference oscillation signal Fref by counting the division oscillation signal Fdiv by means of the reference oscillation signal Fref, and outputs a trimming signal (frequency adjustment signal) TRM having a digital code according to the frequency difference. The adder ADD synthesizes a detection result (a digital output of the frequency difference detection counter FCNT) of the frequency difference and a detection result (a digital output of the time difference detection circuit TDC) of the phase difference by the digital phase difference detector DPFD.

The digital low-pass filter DLPF applies averaging processing to the digital code output from the adder ADD. The decoder DEC decodes (performs code conversion of) the digital code (control signal) serving as a processing result of the digital low-pass filter DLPF, and outputs a fine signal (frequency adjustment signal) FNE and a fractional signal (frequency adjustment signal) FRC serving as an actual digital code (for example, ON/OFF information of a switch) for frequency setting.

The noise intensity detection unit FT1 detects the noise intensity (intensity of the spurious noise) SL of a predetermined frequency component included in the digital code (control signal) output from the digital low-pass filter DLPF. For example, the noise intensity detection unit FT1 detects the noise intensity SL in the predetermined frequency by performing Fourier transform of the predetermined frequency component included in the digital code (control signal) output from the digital low-pass filter DLPF.

The phase difference adjustment unit CTL1 adjusts the phase difference between the reference oscillation signal Fref and the division oscillation signal Fdiv based on a detection result (the noise intensity SL in the predetermined frequency) of the noise intensity detection unit FT1.

Specifically, in a phase difference adjustment mode, the phase difference adjustment unit CTL1 adjusts the phase difference between the reference oscillation signal Fref and the division oscillation signal Fdiv using a plurality of different spans of adjustable range, respectively. In addition, in the phase difference adjustment mode, the noise intensity detection unit FT1 detects the plurality of noise intensities SL in a case where the phase difference is adjusted using the plurality of different spans of adjustable range, respectively. Additionally, in a normal operation rode, the phase difference adjustment unit CTL1 adjusts the phase difference using a span of adjustable range corresponding to the noise intensity SL indicating a minimum value among the plurality of noise intensities SL. That is, the phase difference adjustment unit CTL1 adjusts the phase difference between the reference oscillation signal Fref and the division oscillation signal Fdiv so that the detection result of the noise intensity detection unit FT1 after phase difference adjustment indicates the minimum value.

In the example of FIG. 4, the phase difference adjustment unit CTL1 generates an adjustment signal (a digital value) based on the detection result (noise intensity SL in the predetermined frequency) of the noise intensity detection unit FT1, and outputs it to the adder ADD. The adder ADD adds a synthesis result (digital code) of an output of the digital phase difference detector DPFD to the adjustment signal (digital value) from the phase difference adjustment unit CTL1, and outputs the addition result. As a result, the phase difference between the reference oscillation signal Vref and the division oscillation signal Fdiv is adjusted by a phase difference corresponding to the adjustment signal (digital value) A detailed description of operation of the noise intensity detection unit FT1 and the phase difference adjustment unit CTL1 will be given later.

<<Digital Control Oscillator DCO>>

The digital control oscillator DCO is provided with: two PMOS transistors (hereinafter simply referred to as transistors) MP1 and MP2 connected in a cross-coupled manner (one gate is connected to an other drain); two NMOS transistors (hereinafter simply referred to as transistors) MN1 and MN2 connected in the cross-coupled manner; a coil L1; and three types of capacitance banks CBK1 to CBK3. Sources of the transistors MP1 and MP2 are connected to the power source voltages VDD, sources of the transistors MN1 and MN2 are connected to ground power source voltages VSS, drains of the transistors MP1 and MN1 are connected to a node Nrfp, and drains of the transistors MP2 and MN2 are connected to a node Nrfn.

The coil L1 is connected between the nodes Nrfp and Nrfn. The capacitance bank CBK1 is provided with: a capacitance element (for example, an MOS capacity) C11 having one end connected to the node Nrfp; a capacitance element C12 having one end connected to the node Nrfn; and a switch SW10 that is connected between the other end of the capacitance element C11 and the other end of the capacitance element C12. Although a set of circuits including the capacitance elements C11 and C12, and the switch SW10 are here representatively shown, actually, plural sets of such circuits are provided between the nodes Nrfp and Nrfn. Additionally, ON/OFF of the switch SW10 included in each set of such circuits is controlled by the trimming signal TRM from the automatic band selection unit ABS. It is to be noted that capacitance values of the capacitance elements included in the plurality of sets of circuits, respectively, need not necessarily be the same, and that weighting, such as twice, four times, eight times, and . . . , may be appropriately made on the basis of the capacitance element C11 (=C12).

Similarly, the capacitance bank CBK2 is provided with: a capacitance element C21 having one end connected to the node Nrfp; a capacitance element C22 having one end connected to the node Nrfn; and a switch SW20 that is connected between the other end of the capacitance element C21 and the other end of the capacitance element C22, and plural sets of such circuits are provided between the nodes Nrfp and Nrfn. ON/OFF of the switch SW20 included in the each set is controlled by the fine signal FNE from the decoder DEC. Similarly, the capacitance bank CBK3 is provided with: a capacitance element C31 having one end connected to the node Nrfp; a capacitance element C32 having one end connected to the node Nrfn; and a switch SW30 that is connected between the other end of the capacitance element C31 and the other end of the capacitance element C32, and plural sets of such circuits are provided between the nodes Nrfp and Nrfn. ON/OFF of the switch SW30 included in the each set is controlled by the fractional signal FRC from the decoder DEC.

Such digital control oscillator DCO serves as an LC resonance-type oscillation circuit including the coil L1 and the capacitance banks CBK1 to CBK3, and outputs the oscillation signal Fosc1 complementary to the nodes Nrfp and Nrfn. At this time, the transistors MP1 and MP2 and the transistors MN1 and MN2 function as negative resistances. An oscillation frequency of the oscillation circuit is controlled by ON/OFF of each switch in the capacitance banks CBK1 to CBK3, and contributes as a parameter with which the capacitance element included in a set in which the switch has been controlled to be ON defines an oscillation frequency. Here, a relation of each capacitance element in the capacitance banks CBK1 to CBK3 is expressed by C11 (=C12)>C21 (=C22)>C31 (=C32), and for example, the oscillation frequency is adjusted in a unit of 2 MHz by the trimming signal TRM, in a unit of 20 kHz by the fine signal FNE, and in a unit of 1.25 kHz by the fractional signal FRC, respectively.

<<Divider DIV1>>

The divider DIV1 half-divides the oscillation signal Fosc1 amplified by the amplifier AMP to output it as the oscillation signal Fosc2 (for example, approximately 2 GHz). Note that since the divider DIV1 is provided to lower the frequency of the oscillation signal to a level where the multi-modulus divider MMD is able to operate, it need not be provided if there is no necessity of lowering the frequency of the oscillation signal.

<<Multi-Modulus Divider MMD>>

The multi-modulus divider MMD divides the oscillation signal Fosc2 using a division ratio with accuracy substantially not more than a decimal point to output as the division oscillation signal Fdiv (for example, approximately 26 MHz) by dividing and averaging the oscillation signal Fosc2 using a division ratio that changes in chronological order.

(Operation of Digital-Type PLL Circuit 1 Pertaining to the Embodiment)

Figure 5:
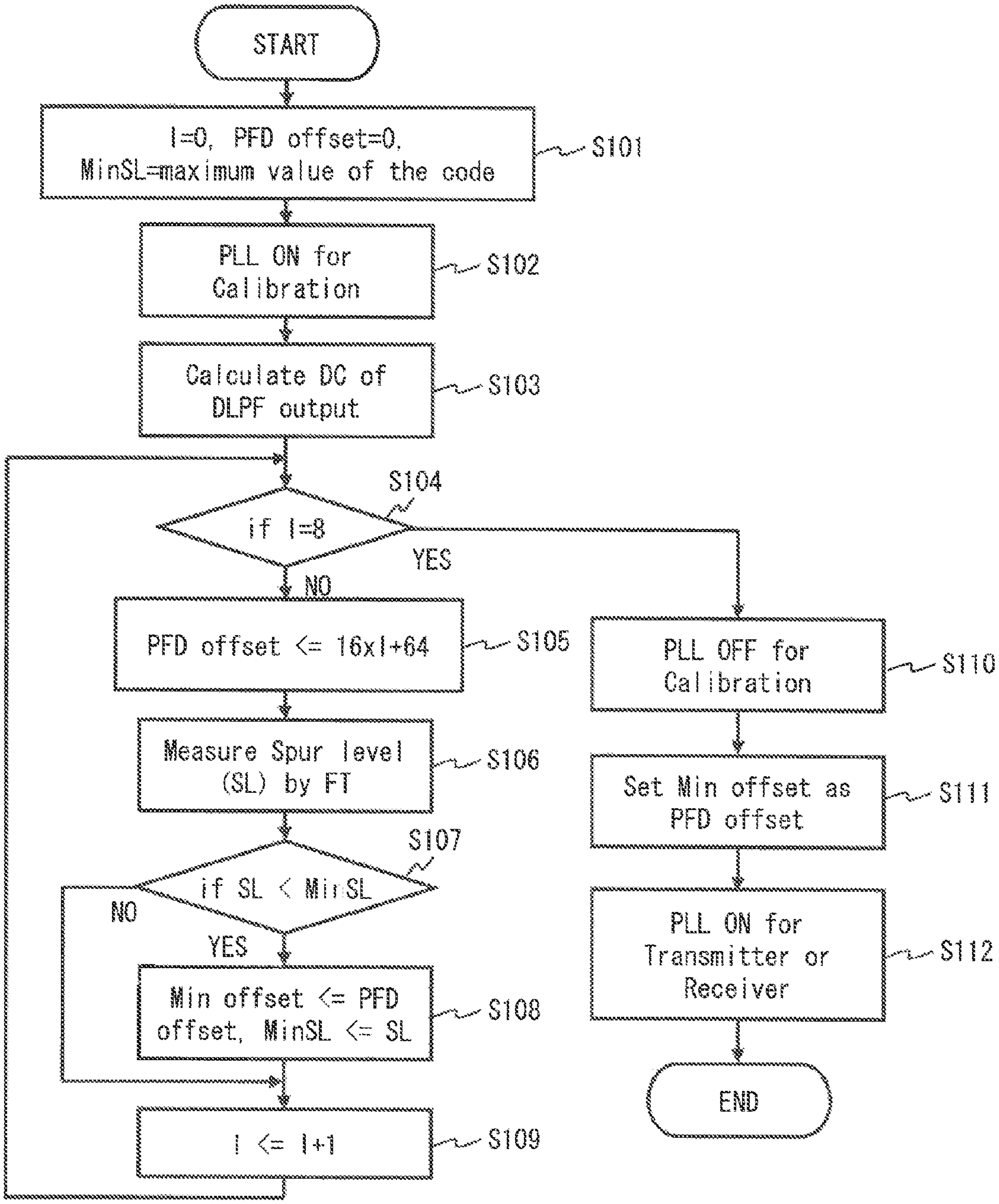
FIG. 5 is a flowchart showing operation of the digital-type PLL circuit pertaining to the first embodiment.
Figure 6:
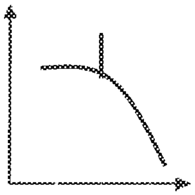
FIG. 6 is a table for explaining the operation of the digital-type PLL circuit pertaining to the first embodiment.
Figure 6:
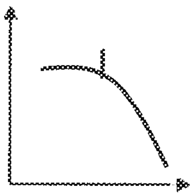
Figure 6:
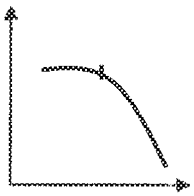
Figure 6:
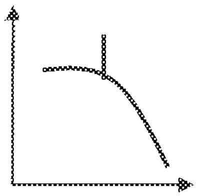
Figure 7:
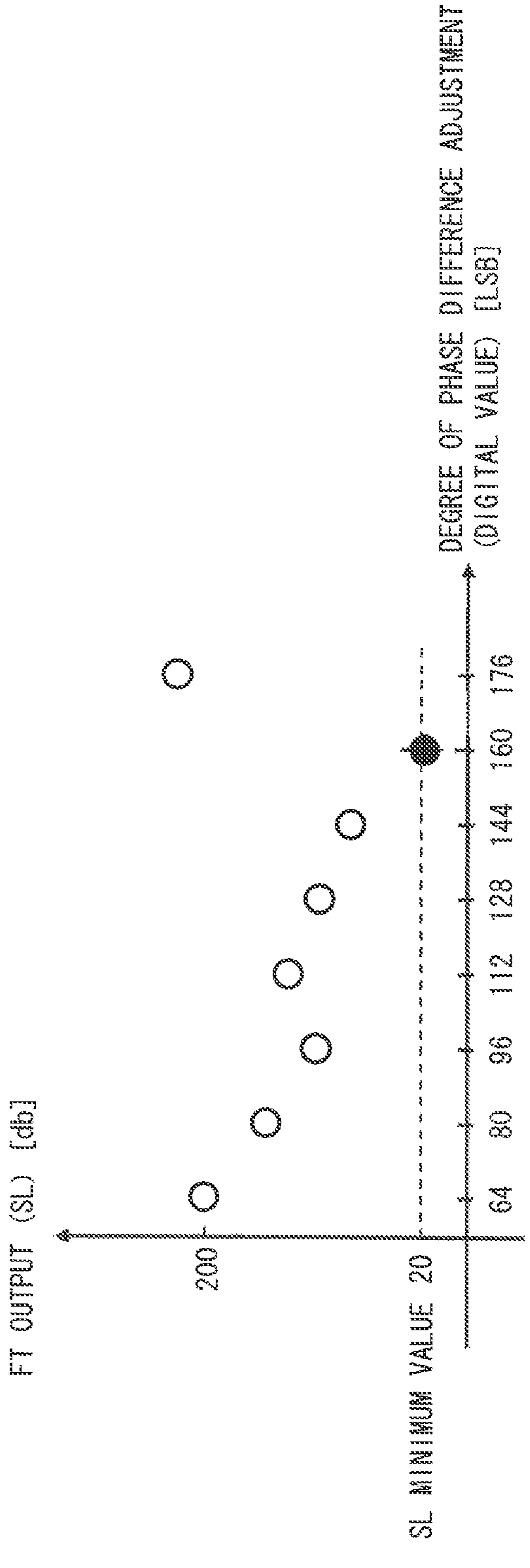
FIG. 7 is a graph showing a relation between a degree of phase difference adjustment made by a phase difference adjustment unit CTL1 and a detection result (noise intensity) obtained by a noise intensity detection unit FT1.

Next, operation of the digital-type PLL circuit 1 pertaining to the embodiment will be explained with reference to FIGS. 5, 6, and 7. FIG. 5 is a flowchart showing the operation of the digital-type PLL circuit 1. FIG. 6 is a table for explaining the operation of the digital-type PLL circuit 1. FIG. 7 is a graph showing a relation between a degree of phase difference adjustment made by the phase difference adjustment unit CTL1 and a detection result (noise intensity SL in a predetermined frequency) obtained by the noise intensity detection unit FT1. It is to be noted that numerical values used in the following explanation are represented with decimal numbers unless otherwise noted.

It is to be noted that the digital-type PLL circuit 1 suppresses a spurious noise generated at a predetermined frequency in the phase difference adjustment mode, before performing an oscillation operation in the normal operation mode. Here, the predetermined frequency, for example, means a specific channel etc. near a center frequency of a band where the phase error characteristic has largely deteriorated due to an effect of the spurious noise. Hereinafter, operation of the digital-type PLL circuit 1 in the phase difference adjustment mode will be mainly explained.

First, in an initial state, a loop variable I is set to be "0", a PFDoffset (a degree of phase difference adjustment by the phase difference adjustment unit CTL1, i.e., a value of an adjustment signal) is set to be "0", and a MinSL (a minimum value of the noise intensity SL) is set to be a maximum value of a digital code (DC) output from the digital low-pass filter DLPF (step S101 of FIG. 5). After that, the digital-type PLL circuit 1 starts a calibration operation (an operation in the phase difference adjustment mode) (step S102 of FIG. 5).

Next, the digital low-pass filter DLPF outputs a digital code (DC) according to the phase difference between the reference oscillation signal Fref and the division oscillation signal Fdiv (step S103 of FIG. 5).

Next, it is determined whether or not the loop variable 1=8 (step S104 of FIG. 5). For example, when the loop variable 1=8 (YES in step S104 of FIG. 5), the program proceeds to processing in step S110. On the other hand, when the loop variable I≠8 (NO in step S104 of FIG. 5), the program proceeds to processing in step S105. Here, although the loop variable I is compared with 8 in step S104, it may be compared with a value smaller or larger than 8 according to the number of loops.

Here, since the loop variable I=0 (I≠8) (NO in step S104 of FIG. 5), PFDoffset is set to be 64 (=16×I+64) LSB (step S105 of FIG. 5). As a result, the phase difference between the reference oscillation signal Vref and the division oscillation signal Fdiv is adjusted by a phase difference corresponding to a digital value 64LSB (for example, a phase of the division oscillation signal Fdiv is advanced).

Next, the noise intensity detection unit FT1 performs Fourier transform of a predetermined frequency component included in the digital code output from the digital low-pass filter DLPF, and outputs the noise intensity (intensity of the spurious noise) in the predetermined frequency (step S106 of FIG. 5). In the example, as shown in FIGS. 6 and 7, when PFDoffset=64LSB, the noise intensity SL=200LSB.

Next, it is determined whether or not the noise intensity SL<MinSL (step S107 of FIG. 5) For example, when the noise intensity SL<MinSL (YES in step S107 of FIG. 5), the program proceeds to processing in step S108. On the other hand, when it is not established that the noise intensity SL<MinSL (NO in step S107 of FIG. 5), the program proceeds to processing of step S109 without performing processing of step S108.

Here, since the noise intensity SL (=200LSB) <MinSL (=a maximum value of the DC) (YES in step S107 of FIG. 5), MinSL is set to be 200LSB (the noise intensity SL at this time), and MinOffset is set to be 64LSB (PFDoffset at this time) (step S108 of FIG. 5).

After that, the loop variable I increases only by "1" (step S109 of FIG. 5), and the program returns to processing in step S104. Processing in steps S104 to S109 is repeated until it is established that the loop variable I=8.

In the example, as shown in FIGS. 6 and 7, when PFDoffset=160LSB (i.e., I=6), the smallest noise intensity SL=20LSB. Accordingly, at the time of it being established that the loop variable 1=8, MinSL is set to be 20LSB, and MinOffset is set to be 160LSB.

When it is established that the loop variable 1=8 (YES in step S104 of FIG. 5), the digital-type PLL circuit 1 stops the calibration operation (the operation in the phase difference adjustment mode) (step S110 of FIG. 5) Additionally, the digital-type PLL circuit 1 sets PDFoffset (the degree of phase difference adjustment by phase difference adjustment unit CTL1, i.e., the value of the adjustment signal) in the normal operation mode to be a final value 160LSB of Minoffset (step S111 of FIG. 5). After that, the digital-type PLL circuit 1 starts an oscillation operation in the normal operation mode (step S112 of FIG. 5). Such processing is performed, and thereby the spurious noise generated in the specific channel (predetermined frequency) is effectively suppressed.

As described above, the digital-type PLL circuit 1 pertaining to the embodiment can suppress the spurious noise generated in the PLL band in the specific channel. As a result of this, deterioration of the phase error characteristic in the specific channel is suppressed.

It is to be noted that if a channel and a spurious type are previously determined, Fourier transform may just be performed only at a specific frequency, and thus a circuit scale is reduced.

Second Embodiment

Figure 8:
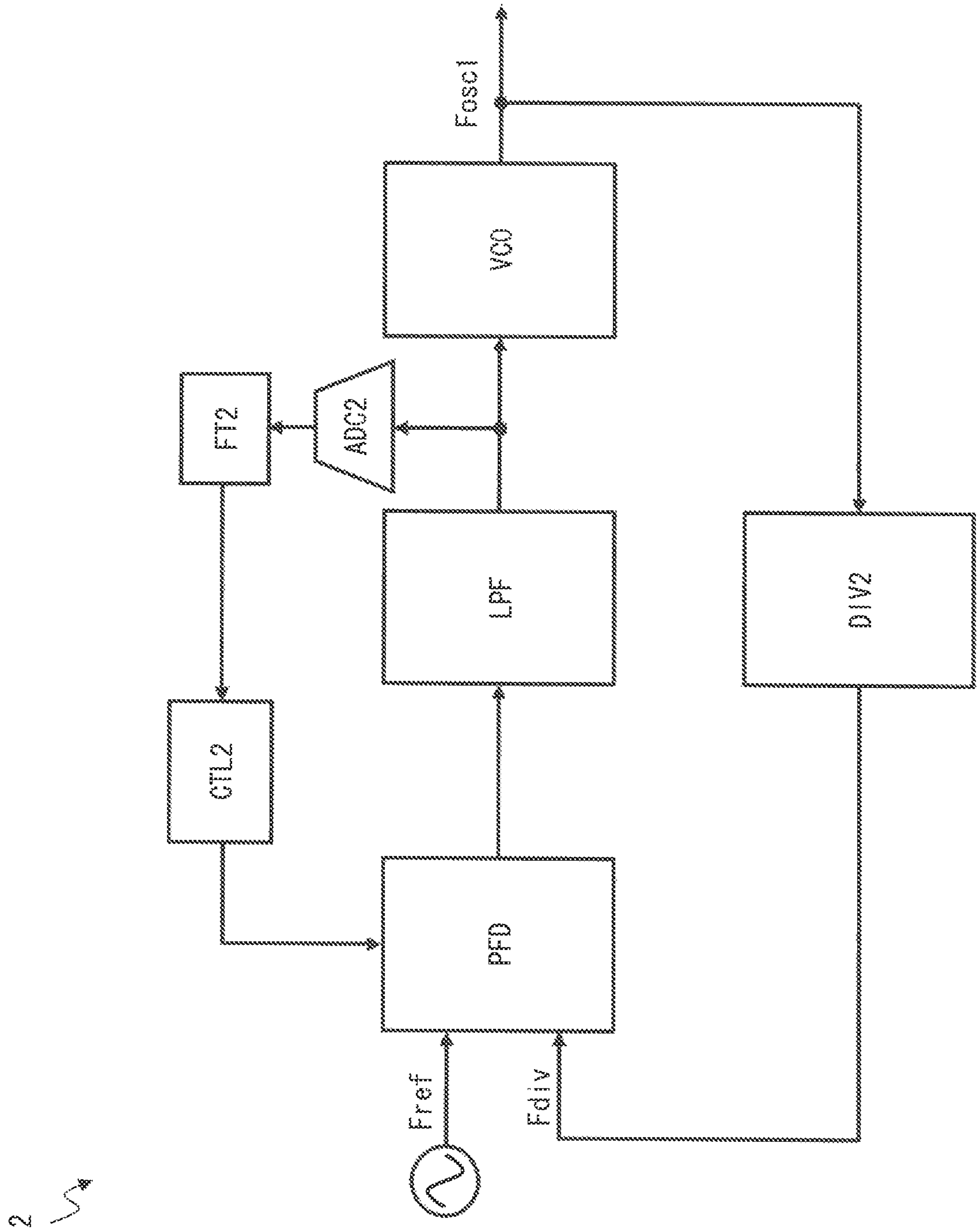
FIG. 8 is a diagram showing a configuration example of a PLL circuit pertaining to a second embodiment.

FIG. 8 is a block diagram showing a configuration example of a digital-type PLL circuit 2 pertaining to a second embodiment. The PLL circuit 2 shown in FIG. 8 is a PLL circuit in which analog control is employed in a part thereof unlike the digital-type PLL circuit 1 shown in FIG. 4. Hereafter, the digital-type PLL circuit 2 will be specifically explained.

The PLL circuit 2 shown in FIG. 8 is provided with: a phase difference detector PFD; a low-pass filter (filter) LPF; a voltage control oscillator (oscillation unit) VCO; a divider (division unit) DIV2; an AD converter ADC2; a noise intensity detection unit FT2; and a phase difference adjustment unit CTL2.

The digital phase difference detector PFD detects the phase difference between the reference oscillation signal Fref and the division oscillation signal Fdiv. The low-pass filter LPF outputs a control voltage according to a detection result of the phase difference detector PFD. The voltage control oscillator VCO outputs the oscillation signal Fosc1 of a frequency according to the control voltage. The divider DIV2 divides the oscillation signal Fosc1, and outputs it as the division oscillation signal Fdiv.

The AD converter ADC2 converts the control voltage (analog signal) output from the low-pass filter LPF into a digital signal, and outputs it.

The noise intensity detection unit FT2 detects the noise intensity (the intensity of the spurious noise) SL of a predetermined frequency component included in an output signal of the AD converter ADC2. For example, the noise intensity detection unit FT2 performs Fourier transform of the predetermined frequency component included in the output signal of the AD converter ADC2, and thereby detects the noise intensity SL in the predetermined frequency.

The phase difference adjustment unit CTL2 adjusts the phase difference between the reference oscillation signal Fref and the division oscillation signal Fdiv based on a detection result (the noise intensity SL in the predetermined frequency) of the noise intensity detection unit FT2.

Specifically, in the phase difference adjustment mode, the phase difference adjustment unit CTL2 adjusts the phase difference between the reference oscillation signal Fref and the division oscillation signal Fdiv using a plurality of different spans of adjustable range, respectively. In addition, in the phase difference adjustment mode, the noise intensity detection unit FT2 detects the plurality of noise intensities SL in a case where the phase difference is adjusted using the plurality of different spans of adjustable range, respectively. Additionally, in the normal operation mode, the phase difference adjustment unit CTL2 adjusts the phase difference using a span of adjustable range corresponding to the noise intensity SL indicating a minimum value among the plurality of noise intensities SL. That is, the phase difference adjustment unit CTL2 adjusts the phase difference between the reference oscillation signal Fref and the division oscillation signal Fdiv so that the detection result of the noise intensity detection unit FT2 after phase difference adjustment indicates the minimum value. As a result, the spurious noise generated in the specific channel (predetermined frequency) is effectively suppressed.

As described above, the PLL circuit 2 pertaining to the embodiment can suppress the spurious noise generated in the PLL band in the specific channel similarly to the case of the digital-type PLL circuit 1 pertaining to the first embodiment. As a result of this, deterioration of the phase error characteristic in the specific channel is suppressed.

Hereinbefore, although the invention made by the present inventor has been specifically explained based on the embodiments, it is needless to say that the present invention is not limited to the previously mentioned embodiments, and that various changes can be made without departing from the spirit of the invention.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising a PLL circuit, wherein the PLL circuit includes:

(a) a phase difference detection unit that detects a phase difference between a reference signal and a division signal;

(b) a filter that outputs a control signal according to a detection result of the phase difference detection unit;

(c) an oscillation unit that outputs an oscillation signal of a frequency according to the control signal;

(d) a division unit that divides the oscillation signal to output it as the division signal;

(e) a noise intensity detection unit that detects a noise intensity of a predetermined frequency component included in the control signal; and (f) a phase difference adjustment unit that adjusts a phase difference between the reference signal and the division signal based on the noise intensity detected by the noise intensity detection unit.

2. The semiconductor device according to claim 1, wherein the noise intensity detection unit detects the noise intensity by performing Fourier transform of the predetermined frequency component included in the control signal.

3. The semiconductor device according to claim 1, wherein the phase difference adjustment unit adjusts the phase difference between the reference signal and the division signal using a span of adjustable range corresponding to the noise intensity indicating a minimum value among the plurality of noise intensities detected in a case where the phase difference has been adjusted using a plurality of different spans of adjustable range, respectively.

4. The semiconductor device according to claim 1, wherein the phase difference adjustment unit adjusts the phase difference between the reference signal and the division signal so that the noise intensity detected by the noise intensity detection unit after phase difference adjustment indicates the minimum value.

5. The semiconductor device according to claim 1, wherein the filter is a digital low-pass filter that outputs a digital code according to the detection result of the phase difference detection unit as the control signal, and the oscillation unit is a digital control oscillator that outputs the oscillation signal of a frequency according to the digital code as the control signal.

6. The semiconductor device according to claim 1, wherein the PLL circuit further comprises an AD converter, the filter is a low-pass filter that outputs the control signal of a voltage value according to the detection result of the phase difference detection unit, the oscillation unit is a voltage control oscillator that outputs the oscillation signal of a frequency according to the voltage value of the control signal, the AD converter converts the voltage value of the control signal into a digital signal, and the noise intensity detection unit detects a noise intensity of a predetermined frequency component included in the digital signal.

7. The semiconductor device according to claim 1 further comprising a mixer that modulates a baseband signal to a high-frequency signal or demodulates the high-frequency signal to the baseband signal based on the oscillation signal.

8. A radio communication terminal according to claim 7 comprising the semiconductor device.

9. A method for controlling a semiconductor device comprising a PLL circuit, including the steps of:

(a) detecting a phase difference between a reference signal and a division signal;

(b) outputting a control signal according to a detection result of the phase difference;

(c) outputting an oscillation signal of a frequency according to the control signal;

(d) dividing the oscillation signal to output it as the division signal;

(e) detecting a noise intensity of a predetermined frequency component included in the control signal; and (f) adjusting the phase difference between the reference signal and the division signal based on the detected noise intensity.

10. The method for controlling the semiconductor device according to claim 9, wherein the noise intensity is detected by performing Fourier transform of the predetermined frequency component included in the control signal.

11. The method for controlling the semiconductor device according to claim 9, wherein the phase difference between the reference signal and the division signal is adjusted by a plurality of different spans of adjustable range, respectively, the plurality of noise intensities are detected in a case where the phase difference has been adjusted by the plurality of different spans of adjustable range, respectively, and the phase difference between the reference signal and the division signal is adjusted using a span of adjustable range corresponding to the noise intensity indicating a minimum value among the plurality of noise intensities.

12. The method for controlling the semiconductor device according to claim 9, wherein the phase difference between the reference signal and the division signal is adjusted so that the noise intensity detected after phase difference adjustment indicates the minimum value.

* * * * *